United States Patent
Chiang et al.

(10) Patent No.: US 6,493,647 B1
(45) Date of Patent: Dec. 10, 2002

(54) METHOD AND APPARATUS FOR EXERCISING EXTERNAL MEMORY WITH A MEMORY BUILT-IN SELF-TEST

(75) Inventors: Sie Boo Chiang, Singapore (SG); Beng Chew Khou, Singapore (SG); Jacques Wong, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/517,053

(22) Filed: Mar. 2, 2000

Related U.S. Application Data

(60) Provisional application No. 60/173,493, filed on Dec. 29, 1999.

(51) Int. Cl.[7] .......................... G01R 31/08; G01R 27/28
(52) U.S. Cl. ................ 702/117; 375/240; 365/201; 709/230; 714/42; 716/4
(58) Field of Search ............................ 702/58, 117, 119, 702/122; 324/73.1, 763; 375/240; 365/201; 709/230; 711/115; 714/30, 42, 711; 716/4

(56) References Cited

U.S. PATENT DOCUMENTS

| | | | |
|---|---|---|---|
| 5,257,388 A | * 10/1993 | Hayamizu | 711/115 |
| 5,423,028 A | * 6/1995 | Schieve et al. | 714/42 |
| 5,617,531 A | * 4/1997 | Crouch et al. | 714/30 |
| 5,640,509 A | * 6/1997 | Balmer et al. | 714/42 |
| 5,812,472 A | * 9/1998 | Lawrence et al. | 365/201 |
| 5,987,632 A | * 11/1999 | Irrinki et al. | 714/711 |
| 5,995,731 A | * 11/1999 | Crouch et al. | 716/4 |
| 6,069,829 A | * 5/2000 | Komai et al. | 365/201 |
| 6,122,320 A | * 9/2000 | Bellifemine et al. | 375/240 |
| 6,226,680 B1 | * 5/2001 | Boucher et al. | 709/230 |

* cited by examiner

*Primary Examiner*—John S. Hilten
*Assistant Examiner*—John Le

(57) ABSTRACT

A method and arrangement for performing a memory built-in self test (MBIST) of an external memory and an internal memory of a network interface controller includes a series of burst write and burst read operations if an external memory is detected. The sequence of burst operations tests the back-to-back burst write, back-to-back burst write burst read, back-to-back burst read and back-to-back burst read burst write capabilities of the external memory, to thereby fully exercise the external memory. Additionally, the internal memory is tested by single write and single read accesses.

16 Claims, 7 Drawing Sheets

METHOD AND APPARATUS FOR EXERCISING EXTERNAL MEMORY WITH A MEMORY BUILT-IN SELF-TEST

RELATED APPLICATIONS

This application contains subject matter related to the subject matter disclosed in U.S. Provisional Patent Application Serial No. 60/173,493, filed on Dec. 29, 1999 (our Docket No. 52352-675).

FIELD OF THE INVENTION

The present invention relates to the field of network communications, and more particularly, to the testing of an external system memory of a network interface controller.

BACKGROUND OF THE INVENTION

Local area networks use a network cable or other media to link stations on the network. Each local area network architecture uses a media access controller (MAC) enabling network interface cards at each station to share access to the media.

Conventional local area network architectures use media access controllers operating according to half-duplex or full-duplex Ethernet (ANSI/IEEE standard 802.3) protocol using a described network medium, such as 10 BASE-T. Newer operating systems require that a network station be able to detect the presence of the network. In an Ethernet 10 BASE-T environment, the network is detected by the transmission of a line pulse by the physical layer (PHY) transceiver. The periodic link pulse on the 10 BASE-T media is detected by a PHY receiver, which determines the presence of another network station transmitting on the network medium based on the detection of the periodic link pulses. Hence, a PHY transceiver at station A is able to detect the presence of station B, without the transmission or reception of data packets, by the reception of link pulses on the 10 BASE-T medium from the PHY transmitter at station B.

Architectures have been developed enabling computers to be linked together using conventional twisted pair telephone lines instead of established local area network media such as 10 BASE-T. Such an arrangement, referred herein as a home network environment, provides the advantage that existing telephone wiring in a home may be used to implement a home network environment. However, telephone lines are inherently noisy due to spurious noise caused by electrical devices in the home, for example dimmer switches, transformers of home appliances, etc. In addition, the twisted pair telephone lines suffer turn-on transients due to on-hook and off-hook and noise pulses from the standard POTS telephones, and electrical systems such as heating and air conditioning systems, etc.

It is therefore important for a MAC to be informed of the conditions existing on a network at any time, and this is especially true in home network architectures. The status information is normally stored by the network controller in an external memory. In addition to the status information, the external memory also stores frame data and control information. The external memory, along with the PC board traces and connections, as well as parts of the logic within the network controller, comprise a memory subsystem. Failures in the memory subsystem may result from electrical or mechanical failure of any of the elements of the system and/or errors in the design of the PC board such as excessive loading or trace length.

In many networking and other products, an embedded memory built-in self test (MBIST) circuit is used to test the internal static random access memory (SRAM) at speed. Normally, this MBIST is a relatively simple circuit to read or write one memory location at each access. In more recent networking products, external SRAM has been more frequently employed in order to store the enormous amount of data required in networking applications. The external memories (SRAM) include different types of SRAM, including pipeline burst SRAM (or PB SRAM), No Bus Latency SRAM (or NoBL SRAM) and Zero Byte Turnaround SRAM (or ZBT SRAM).

For improved performance the above types of external memories allow bursting capability such that every external memory access may initiate multiple (e.g. four) memory locations consecutively. However, using a conventional MBIST that performs single write and single read accesses to test a burst type external memory does not fully test the external memory, since it fails to test the burst operations of the external memory.

SUMMARY OF THE INVENTION

There is a need for a method and arrangement for performing a built-in self test of both internal and external memory of a network interface controller, that adequately tests the capabilities of both types of memories.

This and other needs are met by embodiments of the present invention which provide a method of testing a memory arrangement of a network interface controller comprising the steps of determining whether the memory arrangement includes an external memory and an internal memory in relation to the network interface controller, and conducting a memory built-in self test (MBIST). When the memory arrangement includes both an external memory and an internal memory, the MBIST is conducted by performing back-to-back burst writing and reading operations on the external memory, and single accesses of external memory, followed by performing single accesses of memory locations of the internal memory. When the memory arrangement includes only an internal memory, the MBIST is conducted by performing single accesses of memory locations of the internal memory.

By performing back-to-back burst writing and reading operations, and single accesses of the external memory in the MBIST, adequate testing of the capabilities of the external memory is achieved. The test thus accounts for the burst capability of external memories used in network applications. In certain embodiments of the invention, the additional testing capability for external memories is added to a MBIST already used for testing internal memories with single accesses. This requires less hardware and does not add cost to a chip, such as a network interface controller.

The earlier stated needs are also met by another embodiment of the present invention which provides a network interface controller arrangement comprising a network interface controller having an internal memory, an external memory interface configured to couple an external memory to the network interface controller, and a memory built-in self test (MBIST) controller coupled to the internal memory and the external memory interface. The MBIST controller is configured to detect the presence of an external memory coupled to the external memory interface, and to conduct a MBIST on a detected external memory through the external memory interface and on the internal memory. The MBIST comprises back-to-back burst write and read operations on a detected external memory and single accesses of memory locations of the internal memory.

The foregoing and other features, aspects and advantages of the present invention will become more apparent from the following detailed description of the present invention when taken in conjunction with the accompanying drawings.

DETAILED DESCRIPTION OF THE INVENTION

The present invention addresses and solves the problem, among others, of testing external memories employed in networking applications with a MBIST so as to adequately exercise the external memories. This is achieved by the present invention, in part, by providing a network interface controller with a MBIST that performs burst write and burst read operations on the external memory when an external memory is detected, in addition to single accesses of the external memory. Once the burst operations have been performed for each of the external memory addresses, the single write and single read accesses of the external memory, followed by single accesses of internal memory of the network interface controller, are performed. This accomplishes, in an elegant manner, the testing of the burst capabilities of the external memory, if one is present.

Figure 1:
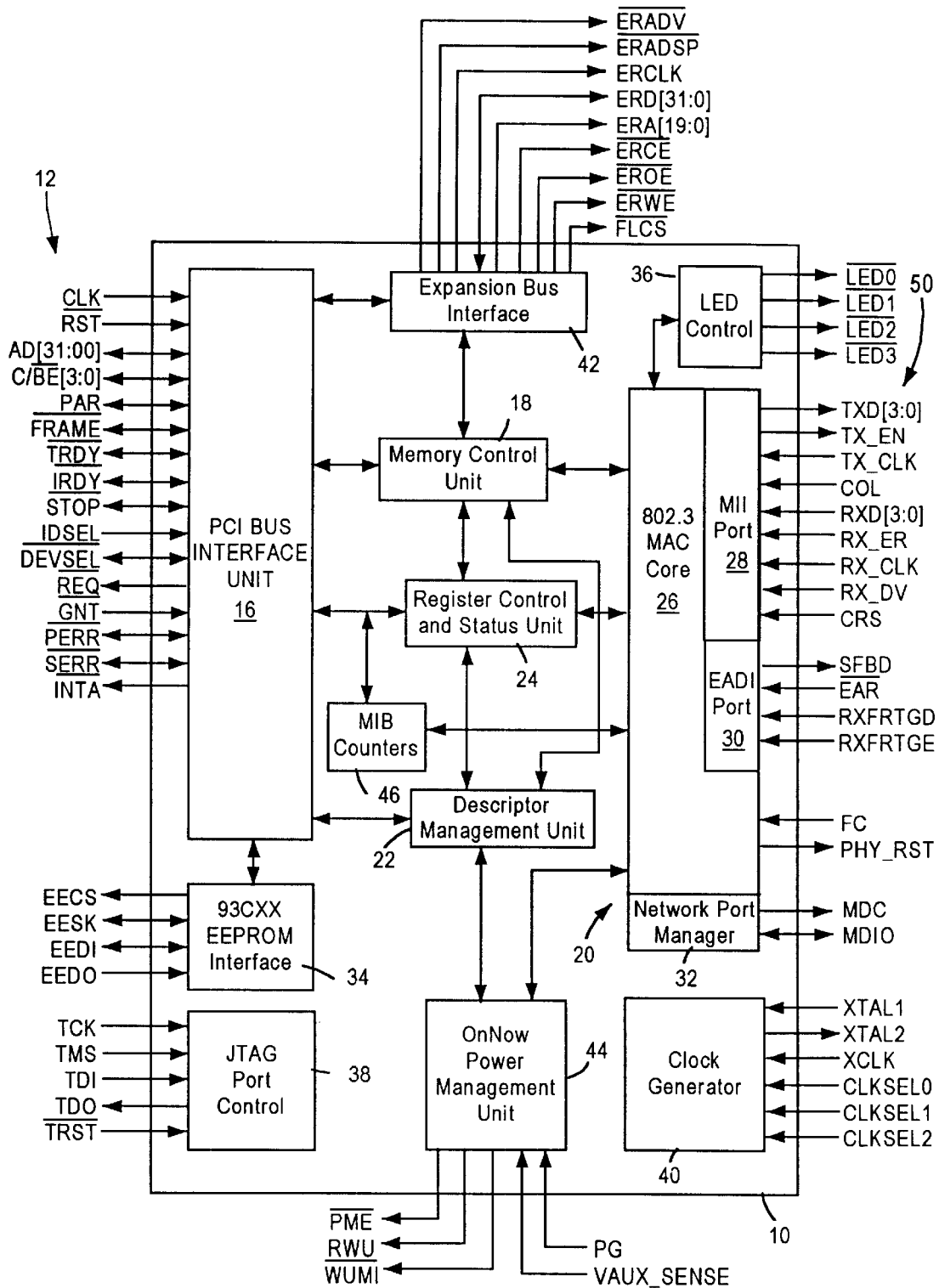
FIG. 1 is a block diagram of a network interface controller constructed in accordance with an embodiment of the present invention, with a network interface controller being coupled to a CPU and an external memory.

FIG. 1 is a block diagram of an exemplary embodiment of a network interface controller constructed in accordance with an embodiment of the present invention. The network interface controller is described in the context of a IEEE 802.3 compliant network interface configured for sending and receiving data packets between a system memory and a network medium using established media access control (MAC) and physical layer (PHY) protocols.

The network interface 10, preferably a single-chip, 32-bit Ethernet controller, provides an interface between a local bus 12 of a computer, for example, a peripheral component interconnect (PCI) local bus, and an Ethernet-based media 50. The reference numeral 50 identifies either an actual network medium, or alternately a signal path (e.g., a media independent interface (MII)) to a physical layer transceiver coupled to the network media.

The network interface 10 includes PCI bus interface unit 16, and memory control unit 18, a network interface portion 20, a descriptor management unit 22 and register control and status unit 24. The network interface portion 20 includes an IEEE 802.3 compliant and full-duplex capable media access control (MAC) core 26, a media independent interface (MII) port 28 for connecting external 10 megabit per second, 100 megabit per second, or 1000 megabit per second transceivers, an external address detection interface (EADI) port 30, and a network port manager unit 32. The network interface 10 also includes an EEPROM interface 34 for reading from and writing to an external EEPROM, on LED control 36, and IEEE 1149.1-compliant JTAG boundary scan test access port interface 38, a clock generation unit 40, and an expansion bus 42. The expansion bus interface unit 42 interfaces to an external data memory 60 for frame data storage, control data storage and status data storage. The expansion interface unit 42 also interfaces to non-volatile (e.g., EEPROM or Flash memory) storage for boot ROM used during start-up.

The PCI bus interface unit 16, compliant with the PCI local bus specification (revision 2.2), receives data frames from a host computer memory via PCI bus 12. The PCI bus interface unit 16, under the control of the descriptor management unit 22, receives transfers from the host computer via the PCI bus 12. For example, transmit data received from the PCI bus interface unit 16 is passed to the memory control unit 18 which stores it in the data memory. Subsequently, the memory control unit 18 retrieves the transmit data from the data memory and passes it to the MAC 26 for eventual transmission to the network. Similarly, received data from the network 50 is processed by the MAC 26 and passed to the memory control unit 18 for storage in the data memory 60. Subsequently, the memory control unit 18 receives the data from the data memory 16 passes it to the PCI bus interface unit 16 for a transfer to the host computer 62 via the PCI bus 12.

The descriptor management unit 22 manages the transfers of data to and from the host computer 62 via the PCI bus interface unit 16. Data structure contained the memory of the host computer 62 specified the size and location of the data buffers along with various control in status information. The descriptor management unit 22 interfaces with the memory control unit 18 to insert control information into the transmitted data stream and to retrieve status information from the received data stream. The network interface portion 20 includes the network port manager 32 that perform auto-negotiation functions my communicating via the media 50 with a corresponding auto-negotiation unit in the link partner (e.g., the centralized hub, repeater, work station, or switch).

The network interface 10 also includes a power management unit 44 that enables remote activation (i.e., turn-on) of the host computer 62 via the network medium 50 by detecting a predetermined pattern on the medium 50 according to Microsoft On Now and ACPI specifications, including compliance with Magic Packet technology and PCI bus power management interface specification protocols.

The network interface 10 also includes a MIB counter unit 46 which excepts information from the MAC 26 regarding frame transmission and reception and maintains the statistics necessary for network management. The statistics are accessed by the host computer 62 via the PCI bus interface unit 16.

Figure 2:
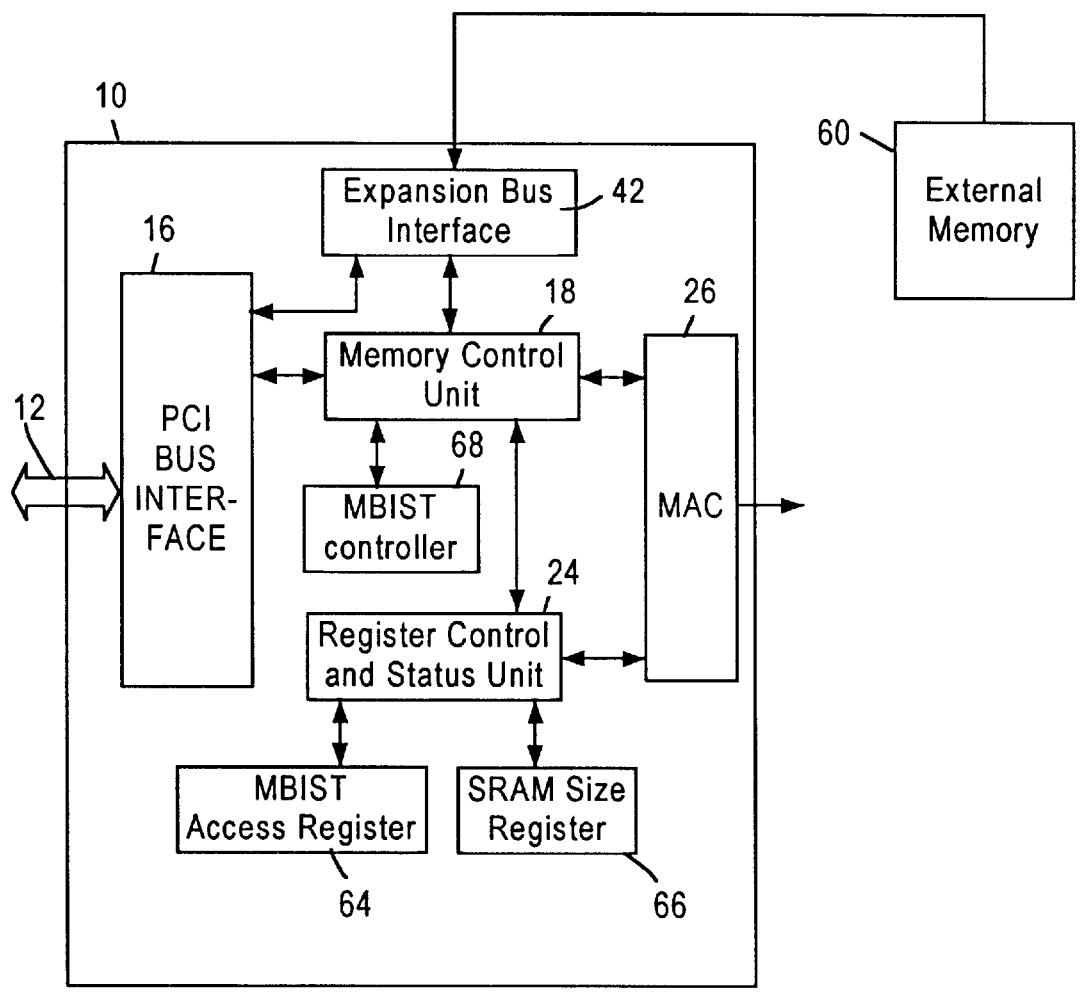
FIG. 2 is a block diagram depicting in block diagram form certain elements of the network interface controller and the external memory in order to highlight certain features of the invention.

FIG. 2 depicts the network interface controller and external memory 60. Only certain elements of the network interface controller 10 are depicted for purposes of the following description.

The network interface controller 10 uses the external memory 60 for receive and transmit status. The size of the memory can be up to 4 Megabytes, in preferred embodiments, organized as 1M×32 bits. The memory size is larger in, other embodiments of the invention. The size of the memory 60 is indicated by the contents of an external memory size register 66. The external memory size is loaded into the external memory size register 66 from an EEPROM interface 34.

The external memory 60 is programmed in units of 512-byte pages. To specify how much of the external memory 60 is allocated to transmit and how much is allocated to receive, a user should program a boundary register (not depicted) with the page boundary where the receive buffer begins. The boundary register is also programmed in units of 512-byte pages. The transmit buffer space starts at the first address in the boundary register. It is up to the user or a software driver to split up the memory for a transmit or receive, and there is no defaulted value in preferred embodiments. The minimum memory size required in preferred embodiments is for 512-byte pages for each transmit and receive queue which limits the memory size to be at least 4 Kbytes.

The network interface controller 10 does not allow software diagnostic access to the external memory 60. However, the network interface controller 10 provides software access to an internal memory built-in self-test (MBIST) controller (i.e. control logic) 68 which runs extensive at-speed tests on the external memory 60, the internal access logic 18 for the memory 60, and PC board interconnect.

The expansion bus interface 42 (external memory interface) includes external memory address pins [19:0] that provide addresses for both the external memory 60 and an external boot ROM device. All of these outputs [19:0] are forced to a constant level to conserve power while no access on the external memory bus is being performed. The ERD [31:0] pins provide data bits [31:0] for external memory 60 accesses. These signals are forced to a constant level to conserve power while no access on the external memory bus is being performed. For boot ROM accesses, the ERD [7:0] pins provide the data bits [7:0] for boot ROM accesses.

$\overline{ERCE}$ serves as the chip enable signal for the external memory 60. This is asserted low when the external memory address on the ERA [19:0] pins is valid.

$\overline{FLCS}$ serves as the chip select for the boot device. It is asserted low when the boot ROM address and ERA [19:0] pins is valid.

$\overline{EROE}$ is the external memory output enable signal that is asserted active low during external memory device read operations to allow the external memory 60 to drive the ERD [31:0] data bus. It is de-asserted at all other times.

$\overline{ERWE}$ is the external memory byte enable that provides the write enable for write accesses to the external memory 60 in the Flash (boot ROM) device.

$\overline{ERADSP}$ is the external memory address strobe signal that provides the address strobe signal to load the address into the external memory 60.

$\overline{ERADV}$ uses the external memory address advance that provides the address advance signal to the external memory 60. This signal is asserted low during a burst access to increment the address counter in the external memory 60.

ERCLK is the reference clock for all synchronous memory accesses.

Referring to FIG. 2, the network interface controller 10 of the present invention employs control logic 68 which controls the MBIST procedure to determine the size of the external memory 60 and verify its correct operation. Before describing the adaptive features of the present invention to accommodate different external memories, the MBIST itself according to embodiments of the invention will be described. The control logic 68 may be part of the memory controller 18 or logically separate from this controller. The control logic 68 employs the MBIST procedure to exercise the memory subsystem. The memory subsystem includes the external memory 60, the input/output logic (the expansion bus interface 42), and the board traces in the external memory 60. This test can run at normal memory operating speed and test normal and/or worst-case access patterns.

The MBIST is a pattern generation test that comprises writing data to the external memory 60 and reading this data from the external memory 60 and comparing it with expected data. Typically, such a MBIST is found in tightly coupled MBIST logic that tests for fabrication errors. The term "tightly coupled" is meant to indicate that the logic is located physically within the RAM block and has access to internal RAM signals that are not usually accessible via pins on the edges of a RAM chip. By contrast, the present invention provides MBIST logic on the network interface controller 10, which connects to an external memory 60, and is thus not tightly coupled. This allows different sized external memories 60 to be used in accordance with the requirements of the user.

The controller logic 68 employs the MBIST register 64 and an SRAM size register 66 to perform the size determination and verify the operation of the external memory 60. These registers may form part of the register control and status unit 24. A schematic depiction of the MBIST register 64 is provided in FIG. 3. The MBIST register 64, in preferred embodiments, is a 64 bit register. A description of the bit fields in the register now follows.

Bit 63 is the DM_DONE bit which indicates whether the MBIST is done. This bit is set to 1 when the automatic memory test has stopped, either because the test has completed or because an error was detected. It is cleared to 0 when either a DM_START or DM_RESUME is set. The DM_DONE bit is read-only.

Bit 62 is the DM_ERROR bit, which acts as the MBIST error indicator. This bit is set to 1 when the memory test logic has detected a memory error. It is cleared to 0 when either DM_START or DM_RESUME is set. This bit is also read-only.

DM_START is the MBIST start bit. Setting this bit to 1 resets the MBIST logic, including the DM_ERROR and DM_TEST_FAIL bits, and starts the memory test process. DM_START should not be set at the same time that the DM_RESUME bit is set. When the memory test stops, the DM_START bit is automatically cleared. This bit is read/write.

DM_RESUME bit is bit 60 and acts to resume the MBIST. Setting this bit to 1 restarts the memory test sequence at the point where it last stopped. Setting this bit clears the DM_ERROR bit, but it does not clear the DM_TEST_FAIL bit. This bit should not be set at the same time that the DM_START bit is set. The DM_RESUME bit is automatically cleared when the memory test stops. This bit is read/write.

The DM_FAIL_STOP bit is bit 59 and performs the MBIST stop on failure control. When this bit is set to 1, the memory test will stop each time an error is detected. When this bit is cleared to 0, the memory test will run to completion, regardless of the number of errors that are detected. This bit is read/write.

Bit number 58 is the DM_TEST_FAIL bit that acts as the MBIST test failure indicator. This bit is set when a memory test error is detected. It is reset when DM_START is set to 1. It is not cleared when DM_RESUME is set to 1. This bit is read only.

Bit number 57 is reserved, and written as 0, read as undefined.

DM_DIR bit (bit 56) is the MBIST test direction. This bit is set to 1 when the MBIST memory pointer was counting down when the test stopped. It is cleared to zero when the MBIST memory pointer was counting up when the test stopped. This bit is read only.

Bit 55–54 represent the DM_FAIL_STATE bits and acts as the MBIST error offset indicator. This field indicates offset of the location of the last memory test error with respect to the value of the DM_ADDR field. Interpretation of this field depends on the value of the DM_DIR field which indicates whether the address pointer was counting up or down when the error was detected. This field is read only. An exemplary assignment of the error location as a function of the DM_DIR bit and the DM_FAIL_STATE bits is provided below.

| DM_DIR | FAIL_STATE | Error Location |
|--------|------------|----------------|
| 0 | 00 | Error at DM_ADDRESS |
| 0 | 01 | Error at DM_ADDRESS−1 |
| 0 | 10 | Error at DM_ADDRESS−2 |
| 0 | 11 | Error at DM_ADDRESS−3 |
| 1 | 00 | Error at DM_ADDRESS |
| 1 | 01 | Error at DM_ADDRESS+1 |
| 1 | 10 | Error at DM_ADDRESS+1 |
| 1 | 11 | Error at DM_ADDRESS+3 |

The DM_BACKG bits 53–52 form the MBIST background bits. This field contains the background pattern that the memory test logic was using when the test stopped. This field is read-only.

Bits 51–32 are the DM_ADDR bits and form the MBIST address. This field contains the contents of the MBIST address pointer at the time of the test stop. Because of the pipelined nature of the external memory 60, this value may not be the location of the memory error. The actual error location is obtained by adding or subtracting the contents of the DM_FAIL_STATE field as described above. This field is read-only.

The DM_DATA bits are bits 31–0. This field contains the last data that the memory test logic read from the external memory 60. If the DM_ERR and DM_FAIL_STOP bits are both set to 1, the contents of this field contains an error. This field is read only.

Figure 3:
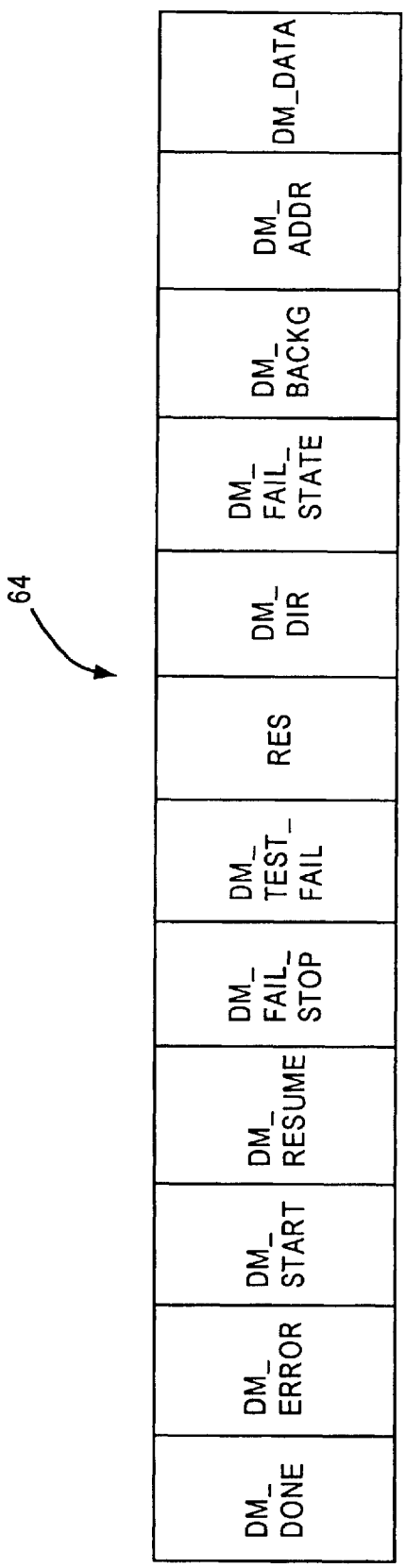
FIG. 3 is a schematic depiction of an MBIST register in accordance with an embodiment of the present invention.

Although the specific assignment bits in the MBIST register are provided in FIG. 3 and the above description, this assignment of bits is exemplary only as the MBIST register 64 may be configured differently but otherwise consistent with the description of the present invention. The contents of the register are cleared to 0 when the reset pin is asserted.

Figure 4:
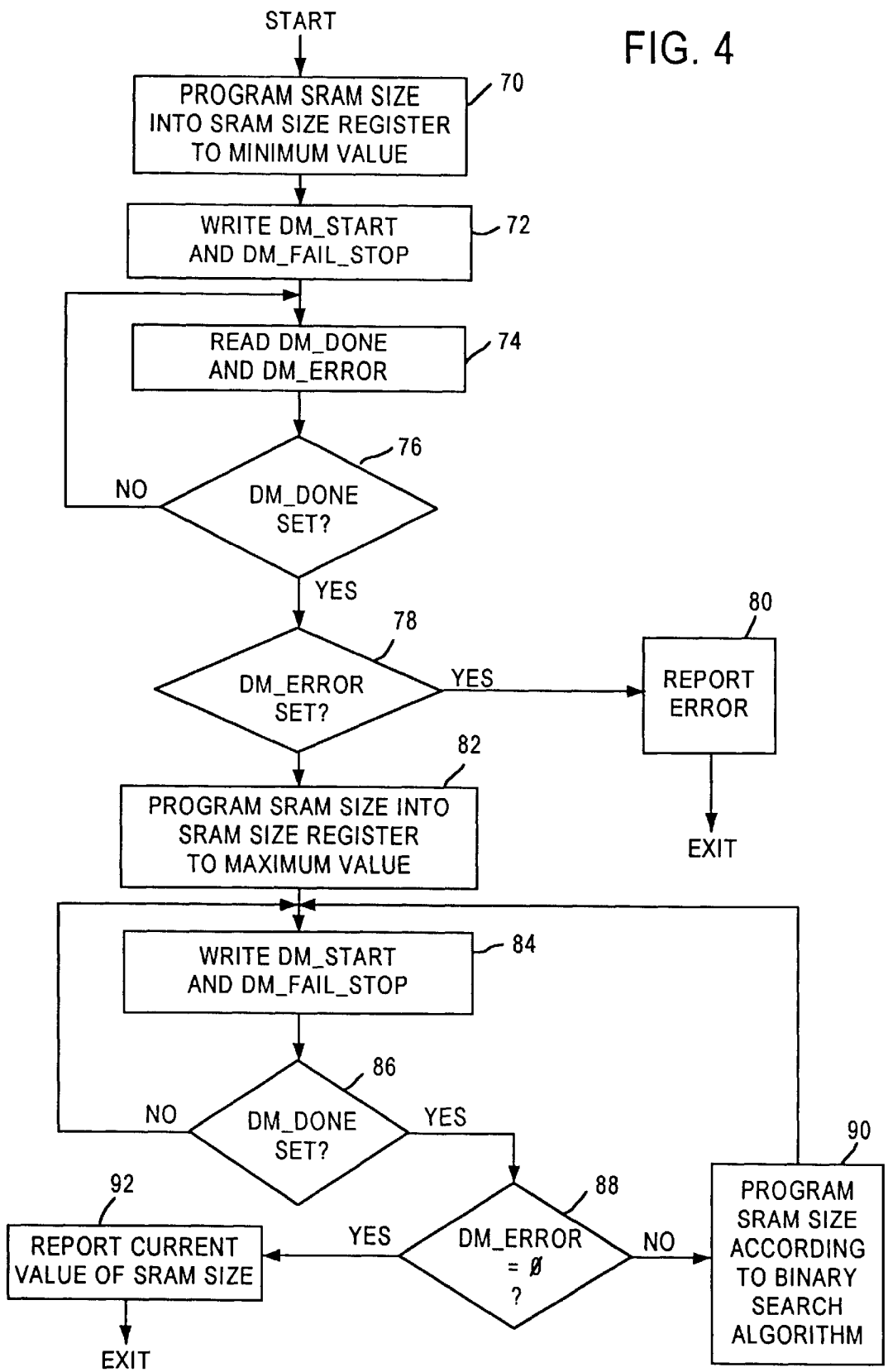
FIG. 4 is a flow chart of an exemplary method of performing an MBIST in accordance with an embodiment of the present invention.

FIG. 4 is a flow chart of an exemplary embodiment of the method of verifying the operation of the external memory 60 and its size, using the control logic 68 in accordance with embodiments of the present invention. After the network interface controller 10 is started, the external memory (SRAM) size is programmed into the SRAM_SIZE register 66 to a minimum allowed value of 4. After this step is completed, the procedure continues to step 72, in which the DM_START and DM_FAIL_STOP bits in the MBIST register 64 are written. For example, bits 63:56 are written with 0×28. The remainder of the MBIST register 64 ignores writes so that it may be written with arbitrary data or not written at all. This action automatically starts the memory test process by the control logic 68.

The control logic 68 reads the DM_DONE bit (bit 63) and the DM_ERROR bit (bit 62) until the DM_DONE bit 63 is set to 1. This is depicted in FIG. 4 as steps 74 and 76. Once the DM_DONE bit is set, as determined in step 76, it is then determined in step 78 whether the DM_ERROR bit is set. If the DM_ERROR bit is set, the external memory 60 is considered defective, the error is reported in step 80 and the memory test process is exited.

When the DM_DONE bit is set, as determined in step 76, but the DM_ERROR bit is not set as determined in step 78, then the SRAM_SIZE register 66 is reprogrammed to the maximum value 0×8000, as depicted in step 82. Steps 74 and 76 are then re-performed as steps 84 and 86. In other words, the DM_START and DM_FAIL_STOP bits are written in the MBIST register 64 by the control logic 68. The memory test is then performed again until the DM_DONE bit is set, with the control logic 68 reading the DM_DONE and DM_ERROR bits. The process loops back to step 84 if the DM_DONE bit is not set as determined in step 86.

When the memory test is completed, indicated by the DM_DONE being set that is determined in step 86, it is again determined whether the DM_ERROR bit is set. If the DM_ERROR is 0, the current value in the SRAM_SIZE register 66 is reported out to the CPU 62 as the size of the external memory (step 92). The process is then exited. If the DM_ERROR bit is not set (i.e. not equal 0), the SRAM_SIZE register 66 is programmed to 1/12 the maximum (0×4000) and steps 84–86 are repeated. This process of reprogramming the SRAM_SIZE and performing the memory test until the DM_ERROR bit is 0, is repeated using the binary search algorithm until the size of the external memory 60 is determined.

The above-described MBIST provided by the MBIST controller 68 is employed regardless of the type of external memory 60 coupled to the external memory interface 42. The present invention employs adaptive logic 69 in the MIBST controller 68 to determine the actual failing address of an MBIST independent of the external memory type.

Figure 5:
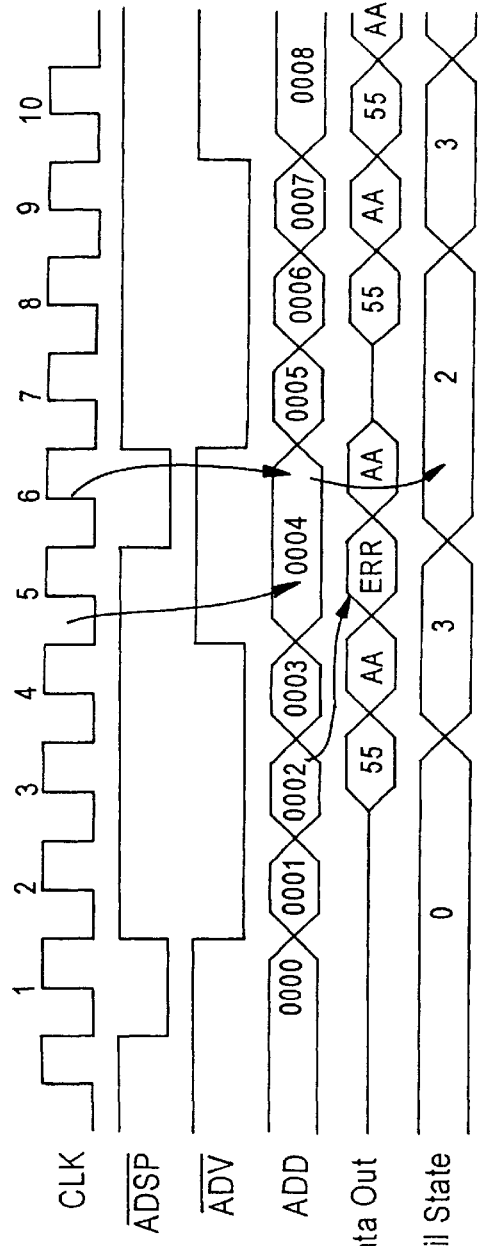
FIG. 5 is an exemplary timing diagram of a back-to-back burst read access of a pipeline burst RAM during a MBIST in accordance with embodiments of the present invention.

The concern regarding different type external memories, in conjunction with testing these memories with a single MBIST, is relieved by providing a fail state indicator used by the adaptive logic 69 to accurately determine the memory location of a MBIST failure. FIG. 5 depicts a back-to-back burst read access of an external memory of a pipeline burst SRAM, and FIG. 6 depicts a back-to-back burst read access of a zero byte turnaround SRAM.

Figure 6:
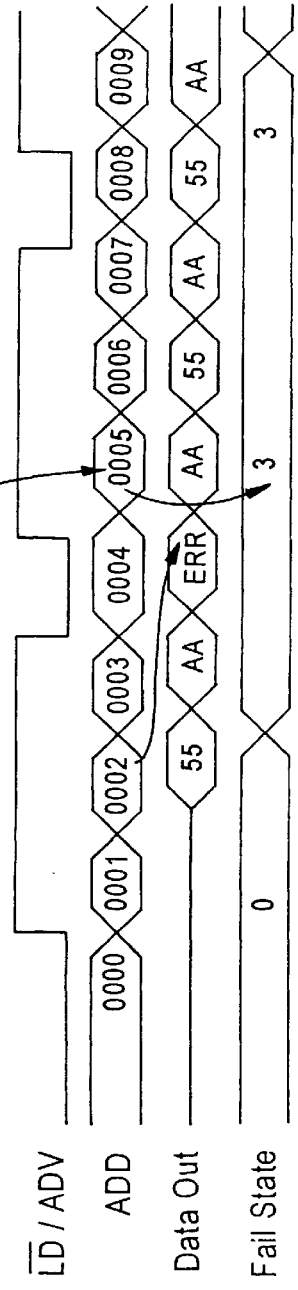
FIG. 6 is an exemplary timing diagram of a back-to-back burst read access of a Zero Byte Turnaround RAM during a MBIST in accordance with embodiments of the present invention.

A comparison of the exemplary timing diagrams of FIGS. 5 and 6 reveal the concern with using a single MBIST with different external memory types. Due to the latency required when performing back-to-back operation in a pipeline burst SRAM, the MBIST counter does not increment at clock 6, for example (FIG.5) By comparison, the zero byte turnaround SRAM has no such latency constraint (FIG. 6). Accordingly, the MBIST controller 68, when performing the MBIST, would have difficulty in pinpointing the exact location of the failed memory location.

As seen in FIG. 5 a back-to-back burst read access operation is being performed. In the pipeline burst SRAM, assume that memory location 0002 is the location to be tested. The data will only be available at clock 5. If the data being read is wrong, the MBIST controller 68 flags an error at clock 6. The address counter of the MBIST at clock 6, as seen in FIG. 5, is registered with address 0004. However, this address (0004) is not the actual memory location of the failure. The actual memory location is 0002, or 2 locations less than that registered with the MBIST address counter.

As another example, using the same FIG. 5, if the memory location of the failure is 0001, the error would be flagged at clock 5. The MBIST address counter would also be registered with memory location 0004 at clock 5, as it was in the previous example at clock 6. In this case, though, the actual memory location of the failure is 0001 is 3 locations less than that registered with the MBIST address counter.

These examples demonstrate that the one clock latency of the pipeline burst SRAM when performing back-to-back operation causes the MBIST controller 68 difficulty in determining the actual 10 failing location, as it is not consistently offset from the location registered with the MBIST address counter when the failure is flagged. When a different type of SRAM is used, such as a zero byte turnaround SRAM, the latency concerns may be different. For example, in FIG. 6, there is no latency problem in back-to-back operation. Hence, an error at location 0002 will be reported at clock 6, registered with memory location 5. The offset of reported memory location and the actual failing memory location remains at 3 (0005–0002), throughout the back-to-back burst read access. The MBIST controller 68 therefore needs to be aware of the type of external memory 60 coupled to the external memory interface 42 of the network interface controller 10. Once properly informed of the external memory type, the MBIST controller 68 can use the same MBIST for each external memory type, but take account of the different latencies of the different types to accurately determine the actual failing memory location.

The present invention employs a fail state indicator that indicates the state of the MBIST control state machine when an error occurs, in order to determine the actual failing memory location. The fail state indication (DM_FAIL_STATE) is stored in the MIST 64, as described earlier. Also stored in the MBIST register 64 is the address direction (DM_DIR), the address location at the time the MBIST was stopped (DM_ADDR), and the last data (DM_DATA) that the MBIST controller 68 read from the external memory 60. The expected data is built from the data background (DM_BACKG). These are two bits (00, 01, 10, 11) that are duplicated, in preferred embodiments, to from the input to the external memory during the MBIST. For example, with an 8-bit data bus, the expected data can be built using the two data background bits by replicating the bits four times. This produces expected data of 00000000, 01010101, 10101010, or 11111111. This scheme of replicating the data background bits reduces the number of registers required for the MBIST.

In preferred embodiments of the invention, the address direction and the fail state indicator are used by the MBIST controller 68 to calculate the actual failing memory location. The MBIST controller 68 will then report this failing memory location to the user. During the MBIST, the value of DM_FAIL_STATE in the MBIST register 64 is changed by the MBIST control state machine in accordance with the type of external memory 60 and the current state of the memory operation. For example, by examining the SRAM_TYPE field in a configuration register, the MBIST controller 68 is aware that the external memory is a pipeline burst SRAM (assuming such a memory is coupled to the external memory interface 42). During the one clock latency between bursts (clocks 5 and 6 in FIG. 5), the MBIST control state machine changes the value of DM_FAIL_STATE in the MBIST register 64 from '11' to '10'. This indicates, as shown in FIG. 5, that the offset to determine the actual failing memory location from the address of the memory being read when the error is flagged, has changed from 3 to 2. Hence, in the example of FIG. 5, an error at location 0002 is flagged at clock 6, registered with address 0004. The value of DM_ADDR is therefore equal to 0004. The address direction (DM_DIR) is set to '0', indicating that the MBIST control state machine is counting up. The value of DM_FAIL_STATE at this time is set to '10', indicating an offset of −2, since DM_DIR has a value of '0'. (If DM_DIR was set to '1', the offset would be +2).

The MBIST controller examines the MBIST register 64 when the MBIST stops and an error is detected, as discussed earlier with respect to the exemplary method of FIG. 4. The offset is obtained from the DM_FAIL_STATE and DM_DIR values, and the actual failing memory location is then calculated by the MBIST controller 68 by offsetting the value of DM_ADDR with the determined offset value.

In the example of a different type of external memory, such as a zero byte turnaround SRAM, the value of DM_FAIL_STATE may not be changed during the MBIST, as the latency concerns are not the same as in the pipeline burst SRAM. The present invention, however, provides flexibility to allow the same MBIST to be used with different types of external memories, by accounting for the different latencies of these different memory types. The invention is therefore not limited to the two different types of external memory types described above as exemplary external memories for coupling to the network interface controller, but rather, may be used with other types of external memories. The MBIST control state machine would then be required to properly set the value of the fail state indicator.

The implementation of the 2-bit fail state indicator of the present invention can be readily incorporated into existing MBIST state machines. This is shown in a following partial Verilog HDL code which shows the burst access mode of the implementation. The states BR1, BR2, BR3, and BR4 represent the burst read of first, second, third and fourth memory locations respectively. As the data is available to be read two clocks later, the fail-state signal is latched twice (e.g., through to D flip-flops) before updating the scan out information in the MBIST register 64.

```
BR1: begin
   NEXT_STATE=BR2
   fail-state=2'b11;
end
BR2: begin
   NEXT_STATE=BR3
   fail-state=2'b11;
end
BR3: begin
   NEXT_STATE=BR4
   if (ZBT) fail-state=2'b11 else
   fail-state 2'B10;
end
```

```
BR4: begin
    NEXT_STATE=BR5
    if (ZBT) fail-state=2'b11 else
    fail-state=2'b10;
end . . .
always@(posedge CLK) begin
    fail_state1<=fail_state;
    FAIL_STATE<=fail_state1
end
```

Figure 7:
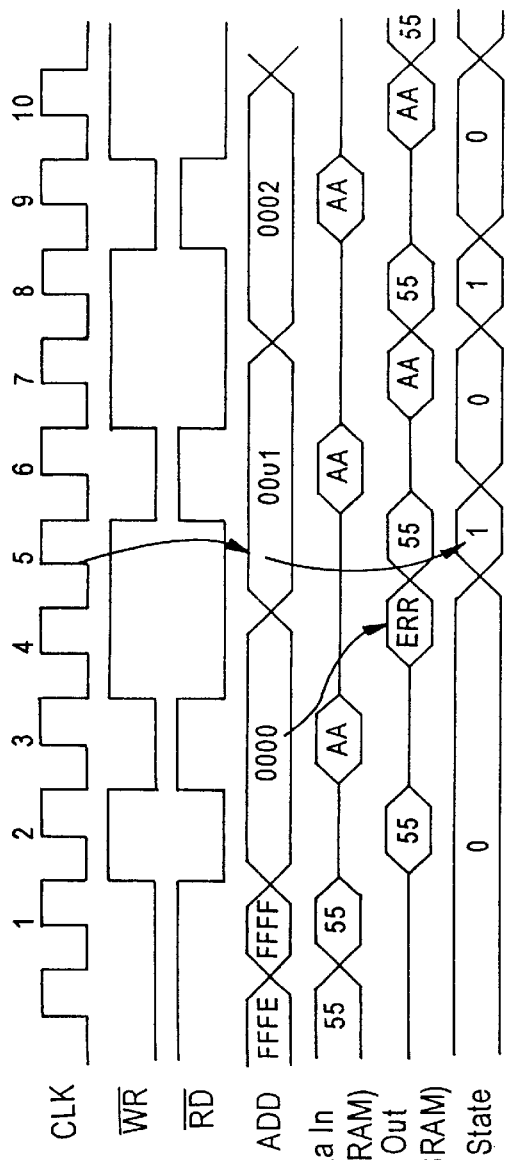
FIG. 7 is an exemplary timing diagram of a single memory location access of memory internal to the network interface controller while the address is ascending, in accordance with embodiments of the present invention.
Figure 8:
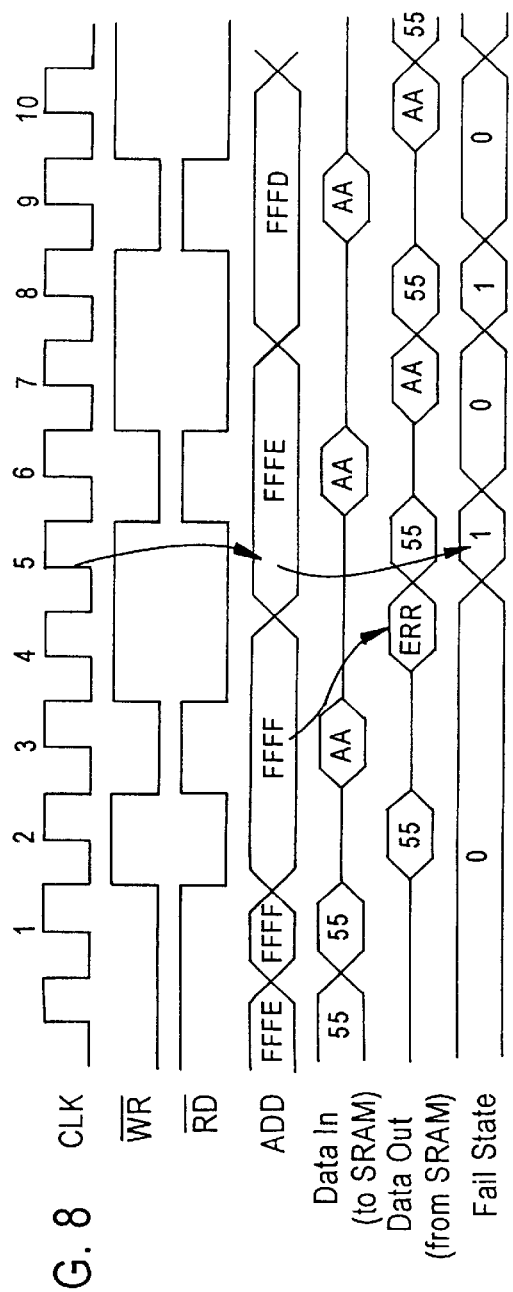
FIG. 8 is an exemplary timing diagram of a single memory location access of memory internal to the network interface controller while the address is descending, in accordance with embodiments of the present invention.

FIGS. 7 and 8 are exemplary timing diagrams of a single memory location access of internal SRAM on the network interface controller 10. This internal SRAM may be part of the memory control unit 18, or logically separate therefrom. In FIG. 7, the address is ascending during the single memory location access, while the address is descending in FIG. 8. In the example of FIG. 7, with the address ascending (DM_DIR ='0'), the actual failed memory location is calculated as 0001−1=0, where 0001 is the value of DM_ADDR and '0' is the actual failing memory location. The offset of '−1' is determined from the value of DM_FAIL_STATE ('01'), which indicates an offset of 1, and DM_DIR ('0'), which indicates that the offset should be subtracted from the value of DM_ADDR.

In FIG. 8, the address is descending, so that DM_DIR will have a value of '1'. The value of DM_ADDR for the error in FIG. 8 is FFFE. Because the addresses are descending (see ADD in FIG. 8), the address offset of 1 (DM FAIL_STATE ='01') is added to the value of DM_ADDR to produce the actual failing memory location. In this example, the actual failing memory location is then FFFE+1=FFFF. This value is reported out to the user by the MBIST controller 68.

Figure 9:
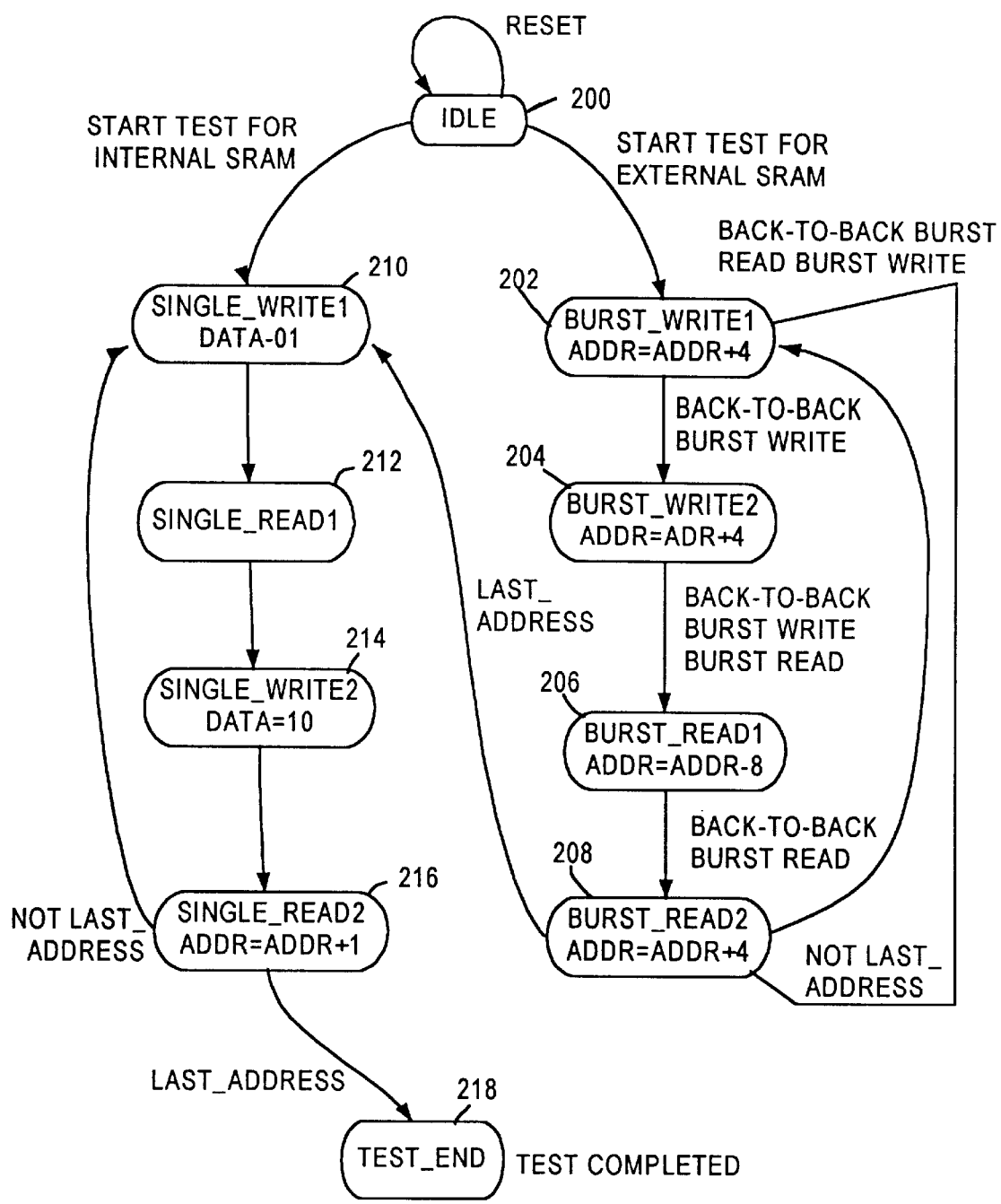
FIG. 9 is an exemplary state machine in accordance with embodiments of the present invention to perform MBIST burst and single mode testing of external and internal memory.

FIG. 9 depicts an exemplary state machine diagram of an MBIST in accordance with embodiments of the present invention. The MBIST of the invention performs testing of an external memory sufficient to test the burst capability of the external memory. It also tests the internal memory with single write and single read accesses.

In FIG. 9, the MBIST state machine, operated by the MBIST controller 68, is initially idle, as indicated by state 200. When an external memory 60 is detected (i.e., coupled -to the external memory interface 42), the MBIST state machine then starts testing the external memory 60.

The first operation tested of the external memory 60 is a back-to-back burst write operation. From the idle state 200, the MBIST state machine enters state 202 (assuming an external memory 60 is detected). In state 202, a first burst write to the external memory 60 is performed. In preferred embodiments, this involves writing a two-bit data pattern, such as '01' by a burst write to a first location in external memory 60, followed by a burst write of a different two-bit pattern, such as '10' to a second location in external memory 60, a burst write of '01 to a third location, and a burst write of '10' to a fourth location. The address of the memory location is advanced so that ADDR=ADDR+4, where ADDR was the address when state 202 was entered.

After the first burst write operation is complete, and the address advanced, the state machine enters state 204, in which a second burst write operation is performed. The second burst write operation is the same as the first burst write operation, except at the next four memory locations. The address is advanced again, after the second burst write operation is performed, so that ADDR=ADDR +4.

The above two burst write operations are performed back-to-back, so that state 202 followed by state 204 forms a back-to-back burst write test of the external memory 60.

Following the completion of the second burst write and the advancement of the address, the MBIST state machine enters state 206, in which a first burst read operation is performed. The address is now decremented to ADDR= ADDR −8. The first burst read operation includes reading the data in the first memory location in the external memory 60. The expected data is '01', as this data was supposed to be written into this memory location in the first burst write operation. The first burst read operation is followed in succession by second, third and fourth burst read operations of the second, third and fourth memory locations, respectively. The first burst read operation followed the second burst write operation, so that states 204 and 206 form a back-to-back burst write burst read test of the external memory 60.

The address is now incremented by ADDR=ADDR+4. A second read burst operation is performed when the MBIST state machine enters state 208 from state 206. The second burst read operation is the same as the first burst read operation, except that it reads the next four memory locations in the external memory.

The second burst read operation followed the first burst read operation, so that states 206 and 208 form a back-to-back burst read test of the external memory 60.

After the second burst read operation, in state 208, it is then determined by the MBIST controller 68 whether all of the address (memory) locations in the external memory 60 have been tested. If not, the MBIST state machine returns to state 202 to test the next set of memory locations. As this is a burst read operation followed by a burst write operation, a back-to-back burst read burst write test of the external memory 60 is formed by states 208 and 202.

When all of the memory locations in the external memory have been tested, single access testing of the external memory is started, in state 210. This single access testing of external memory 60 is then followed by single access testing of the internal memory in the same manner as that described below for the external memory 60. Alternatively, if no external memory 60 is detected, state 210 is entered directly from state 200, instead of from state 208.

In state 210, a write of a first data pattern (e.g. '01',) to a first location in the external memory is performed. The MBIST state machine then enters state 212, in which the first location is read, expecting the first data pattern '01'. The same first location in the external memory is then written again, when the MBIST state machine enters state 214. In this case, however, a second data pattern (e.g. '10') is written in the memory location. The memory location is read in state 216, with the '10' pattern forming the expected data pattern. The next address is then retrieved and states 210–216 are repeated until all of the memory locations in the external memory are tested. The test end is formed by state 218.

During testing, if a read of a memory location does not return the expected data, then an error is noted and the MBIST stops, in the manner described earlier, for example.

The present invention provides a method and arrangement for testing the different bursting capabilities of a burst type external memory, without the addition of costly hardware to a chip. This testing is robust, in that each of the different types of burst write and read operation combinations can be tested.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method of testing a memory arrangement of a network interface controller comprising the steps of:

a) determining whether the memory arrangement includes an external memory and an internal memory in relation to the network interface controller;

b) conducting a memory built-in self test (MBIST) by performing back-to-back burst writing and reading operations on an external memory followed by performing single accesses of memory locations of the external memory and single accesses of memory locations of an internal memory when the memory arrangement includes both an external memory and an internal memory; and c) conducting the MBIST by performing single accesses of memory locations of an internal memory when the memory arrangement includes only an internal memory.

2. A method of testing a memory arrangement of a network interface controller comprising the steps of:

a) determining whether the memory arrangement includes an external memory and an internal memory in relation to the network interface controller;

b) conducting a memory built-in self test (MBIST) by performing back-to-back burst writing and reading operations on an external memory followed by performing single accesses of memory locations of the external memory and single accesses of memory locations of an internal memory when the memory arrangement includes both an external memory and an internal memory; and c) conducting the MBIST by performing single accesses of memory locations of an internal memory when the memory arrangement includes only an internal memory, wherein step b) includes performing in sequential order on an external memory:

d) a back-to-back burst write operation;

e) a back-to-back burst write burst read operation;

f) a back-to-back burst read operation; and g) a back-to-back burst read burst write operation.

3. The method of claim 2, wherein step b) includes repeating steps d)-g) for all of the addresses to be tested in an external memory prior to initiating testing of an internal memory.

4. The method of claim 2, wherein steps d)-g) consist of the following steps in sequential order:

h) performing a first burst write operation to a first set of memory locations in an external memory;

i) performing a second burst write operation to a second set of memory locations in an external memory;

j) performing a first burst read operation of the first set of memory locations;

k) performing a second burst read operation of the second set of memory locations; and l) returning to step i) if not all addresses of the external memory have been tested.

5. The method of claim 2, further comprising determining after step f) whether all addresses of the external memory have been tested and: performing step g) if not all addresses of the external memory have been tested; and performing the single accesses of memory locations of an external memory if all addresses of the external memory have been tested.

6. The method of claim 2, wherein said step of conducting a MBIST includes determining a location of an error in said external memory via performing said back-to-back burst writing and reading operations based on a type of said external memory.

7. A method of testing a memory arrangement of a network interface controller comprising the steps of:

a) determining whether the memory arrangement includes an external memory and an internal memory in relation to the network interface controller;

b) conducting a memory built-in self test (MBIST) by performing back-to-back burst writing and reading operations on an external memory followed by performing single accesses of memory locations of the external memory and single accesses of memory locations of an internal memory when the memory arrangement includes both an external memory and an internal memory; and c) conducting the MBIST by performing single accesses of memory locations of an internal memory when the memory arrangement includes only an internal memory, wherein the steps of performing single accesses of memory locations of an external memory and of an internal memory include the following steps performed in sequential order:

d) performing a single write of data in a first data arrangement to a first memory location;

e) performing a single read of the data in the first memory location;

f) performing a single write of data in a second data arrangement to the first memory location;

g) performing a single read of the data in the first memory location; and h) repeating steps n)-q) until all addresses of the internal memory have been tested.

8. The method of claim 7, wherein said step of conducting a MBIST includes determining a location of an error in said external memory via performing said back-to-back burst writing and reading operations based on a type of said external memory.

9. A network interface controller arrangement comprising:

a network interface controller having:

an internal memory;

an external memory interface configured to, couple an external memory to the network interface controller;

a memory built-in self test (MBIST) controller coupled to the internal memory and the external memory interface, the MBIST controller configured to detect the presence of an external memory coupled to the external memory interface, and to conduct a MBIST on a detected external memory through the external memory interface and on the internal memory, the MBIST comprising back-to-back burst write and read operations on a detected external memory, single accesses of the external memory, and single accesses of memory locations of the internal memory.

10. The network interface controller arrangement of claim 9, further comprising an external memory coupled to the external memory interface.

11. A network interface controller arrangement comprising:

a network interface controller having:

an internal memory;

an external memory interface configured to couple an external memory to the network interface controller; and a memory built-in self test (MBIST) controller coupled to the internal memory and the external memory interface, the MBIST controller configured to detect the presence of an external memory coupled to the external memory interface, and to conduct a MBIST on a detected external memory through the external memory interface and on the internal memory, the MBIST comprising back-to-back burst write and read operations on a detected external memory, single accesses of the external memory, and single accesses of memory locations of the internal memory, wherein the MBIST back-to-back burst write and read operations include, in sequential order:
a back-to-back burst write operation;
a back-to-back burst write burst read operation;
a back-to-back burst read operation; and
a back-to-back burst read burst write operation;

12. The network interface controller arrangement according to claim 11, wherein said MBIST controller determines an address location of an error in said external memory via performing said back-to-back burst write and read operations based on a type of said external memory.

13. A network interface controller arrangement comprising:
a network interface controller having:
an internal memory;
an external memory interface configured to couple an external memory to the network interface controller; and
a memory built-in self test (MBIST) controller coupled to the internal memory and the external memory interface, the MBIST controller configured to detect the presence of an external memory coupled to the external memory interface, and to conduct a MBIST on a detected external memory through the external memory interface and on the internal memory, the MBIST comprising back-to-back burst write and read operations on a detected external memory, single accesses of the external memory, and single accesses of memory locations of the internal memory, wherein the MBIST back-to-back burst write and read operations include, in sequential order:
a first burst -write operation to a first set of memory locations in an external memory;
a second burst write operation to a second set of memory locations in an external memory;
a first burst read operation of the first set of memory locations;
a second burst read operation of the second set of memory locations; and
returning to perform the first burst write operation if not all addresses of the external memory have been tested.

14. The network interface controller arrangement of claim 13, wherein the MBIST single accesses of external and internal memory include, in sequential order:
a) a single write of data in a first data arrangement to a first memory location;
b) a single read of the data in the first memory location;
c) a single write of data in a second data arrangement to the first memory location;
d) a single read of the data in the first memory location; and
e) repeating a)-d) until all addresses of the internal memory have been tested.

15. The network interface controller arrangement of claim 14, further comprising an external memory coupled to the external memory interface.

16. The network interface controller arrangement according to claim 13, wherein said MBIST controller determines an address location of an error in said external memory via performing said back-to-back burst write and read operations based on a type of said external memory.

* * * * *